(12) United States Patent
Madsen et al.

(10) Patent No.: US 7,190,393 B2
(45) Date of Patent: Mar. 13, 2007

(54) CAMERA WITH IMPROVED ILLUMINATOR

(75) Inventors: David D. Madsen, Lakeland, MN (US); Eric P. Rudd, Hopkins, MN (US); Mark R. Schoeneck, Bloomington, MN (US); Joseph L. Horijon, Veldhoven (NL)

(73) Assignee: CyberOptics Corporation, Golden Valley, MN (US)

( * ) Notice: Subject to any disclaimer, the term of this patent is extended or adjusted under 35 U.S.C. 154(b) by 0 days.

(21) Appl. No.: 10/793,176

(22) Filed: Mar. 4, 2004

(65) Prior Publication Data

US 2004/0233322 A1    Nov. 25, 2004

Related U.S. Application Data

(63) Continuation of application No. 10/017,512, filed on Dec. 14, 2001.

(60) Provisional application No. 60/255,928, filed on Dec. 15, 2000.

(51) Int. Cl.
*H04N 7/18* (2006.01)

(52) U.S. Cl. ............... 348/131; 348/363; 348/374; 396/449; 396/485; 396/507

(58) Field of Classification Search .......... 348/131, 348/335, 340, 343, 344, 362, 363, 367, 368, 348/374; 396/449, 507, 458, 460, 461, 463, 396/471, 485, 494, 505
See application file for complete search history.

(56) References Cited

U.S. PATENT DOCUMENTS

| | | | | |
|---|---|---|---|---|
| 3,663,098 A | * | 5/1972 | Merchant | 351/211 |
| 4,146,924 A | | 3/1979 | Birk et al. | 364/513 |
| 4,628,464 A | | 12/1986 | McConnell | 364/513 |
| 4,731,923 A | | 3/1988 | Yagi et al. | 29/833 |
| 4,831,549 A | | 5/1989 | Red et al. | 364/513 |
| 5,040,291 A | | 8/1991 | Janisiewicz et al. | 29/840 |
| 5,140,730 A | | 8/1992 | Maskens et al. | 29/33 M |
| 5,148,591 A | | 9/1992 | Pryor | 29/407 |
| 5,210,645 A | * | 5/1993 | Orino et al. | 359/738 |
| 5,297,238 A | | 3/1994 | Wang et al. | 395/94 |
| 5,396,331 A | | 3/1995 | Kitoh et al. | 356/376 |
| 5,457,492 A | * | 10/1995 | Sasaki et al. | 348/126 |

(Continued)

FOREIGN PATENT DOCUMENTS

DE    42 22 283    8/1993

(Continued)

OTHER PUBLICATIONS

U.S. Appl. No. : 10/017,512, filed Dec. 14, 2001.

*Primary Examiner*—David Ometz
*Assistant Examiner*—Chriss S. Yoder
(74) *Attorney, Agent, or Firm*—Westman, Champlin & Kelly, P.A.

(57) ABSTRACT

An illumination and imaging system is provided with a co-axial illuminator that does not include a beamsplitter. The co-axial illuminator achieves efficiencies substantially in excess of those achieved with a beamsplitter. In one aspect, an optical stop is used to reflect illumination upon a target. The optical stop includes an aperture allowing light reflected from the target to pass to a detector. The aperture of the stop has an asymmetrical feature that facilitates operation on specular targets.

18 Claims, 5 Drawing Sheets

U.S. PATENT DOCUMENTS

| | | | |
|---|---|---|---|
| 5,502,890 A | 4/1996 | Gunter | 29/833 |
| 5,526,050 A | 6/1996 | King et al. | 348/387 |
| 5,577,130 A | 11/1996 | Wu | 382/106 |
| 5,684,530 A * | 11/1997 | White | 348/131 |
| 5,694,483 A | 12/1997 | Onoguchi | 382/154 |
| 5,825,495 A * | 10/1998 | Huber | 356/600 |
| 5,905,850 A | 5/1999 | Kaveh | 395/94 |
| 5,970,365 A | 10/1999 | Takamizawa et al. | 219/121.63 |
| 5,982,416 A | 11/1999 | Ishii et al. | 348/29 |
| 5,991,434 A | 11/1999 | St. Onge | 382/146 |
| 6,257,735 B1 * | 7/2001 | Baar | 362/217 |
| 6,317,270 B2 * | 11/2001 | Nagaoka | 359/684 |
| 6,333,826 B1 | 12/2001 | Charles | 359/725 |
| 6,392,688 B1 | 5/2002 | Barman et al. | 348/42 |
| 6,580,449 B1 * | 6/2003 | Meltzer | 348/85 |
| 6,630,998 B1 * | 10/2003 | Welchman et al. | 356/394 |
| 6,667,762 B1 * | 12/2003 | Bouvier et al. | 348/92 |
| 6,678,058 B2 * | 1/2004 | Baldwin et al. | 356/609 |
| 6,731,383 B2 * | 5/2004 | Watkins et al. | 356/237.2 |
| 2002/0181233 A1 | 12/2002 | Adler et al. | 362/247 |
| 2003/0029033 A1 | 2/2003 | Hidese et al. | 29/833 |

FOREIGN PATENT DOCUMENTS

| | | |
|---|---|---|
| DE | 43 39 715 | 4/1995 |
| DE | 41 19 401 | 7/1998 |
| EP | 0 222 072 | 5/1987 |
| EP | 0 330 294 | 8/1989 |
| EP | 0 374 848 | 6/1990 |
| EP | 0 471 272 | 2/1992 |
| EP | 0 525 948 A2 | 2/1993 |
| EP | 0 606 083 | 7/1994 |
| EP | 0 650 319 | 4/1995 |
| EP | 0 767 357 | 4/1997 |
| EP | 0 772 381 | 5/1997 |
| JP | 0040042599 | 2/1992 |
| JP | 0040106939 | 4/1992 |
| JP | 0040307950 | 10/1992 |
| JP | 0050138466 | 6/1993 |
| JP | 0070243810 | 9/1995 |
| JP | 0090210618 | 8/1997 |
| WO | WO 96/12395 | 4/1996 |
| WO | WO 96/12396 | 4/1996 |
| WO | WO 98/08367 | 2/1998 |
| WO | WO 98/24291 | 6/1998 |
| WO | WO 98/32318 | 7/1998 |
| WO | WO 02/102128 | 12/2002 |

* cited by examiner

CAMERA WITH IMPROVED ILLUMINATOR

CROSS REFERENCE TO RELATED APPLICATIONS

This application is a continuation application of Ser. No. 10/017,512, filed Dec. 14, 2001, which claims priority to prior provisional application No. 60/255,928 filed Dec. 15, 2000, entitled CO-AXIAL ILLUMINATOR.

COPYRIGHT RESERVATION

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

The present invention relates generally to automated optical assembly and inspection machines.

These machines are used extensively in the field of surface mount technology (SMT). One example of such a machine is known as a pick and place machine. Pick and place machines are used to automatically place electronics components upon a circuit board during manufacture. Generally a component is picked up by a placement head that is movable with respect to the board. The placement head orients the component correctly and places the component at a desired location on the board.

In order to properly place components, it is necessary to determine the initial orientation and location of the component on the placement head. Additionally, the position of the placement head with respect to the board itself must be known. Once both are known, the position and orientation of the component are adjusted to place the component correctly upon the board. In order to sense component position and alignment, pick and place machines generally employ component align (CA) sensors. In order to sense the position of the placement head with respect to the board, such machines generally employ board align (BA) cameras. The BA camera is used to image a reference position marker or "fiducial" on the circuit board or board artwork. Analyzing the image of the fiducial allows calculation of the BA camera position with respect to the board. Since the BA camera is generally disposed on the placement head, for "on-head" machines, such analysis provides a relationship between the placement head location and the board.

As components get smaller, and placement accuracy increases, it is increasingly important to have very accurate component align sensors and board align cameras. One difficulty in providing accurate images is providing the correct illumination to the target to be imaged. Illumination can vary based upon the type of image being acquired, the reflectivity of the article, the reflectivity of the background of the article, and many other factors.

One popular method of illumination for board align cameras is known as co-axial illumination. Co-axial illumination is defined as illumination directed substantially along the line of sight of the imaging optics. Co-axial illumination is useful in that shadow images are minimized and surface features normal to the optical axis of the camera are illuminated efficiently, especially for objects with specular surfaces. Typically, co-axial illumination is effected using a light source projecting illumination from the side of the optical axis into a beamsplitter which bends the beam such that it aligns with the optical axis of the camera. This technique suffers from at least two limitations. First, the beamsplitter is not an economical part and thus can significantly increase the cost of the system. Second, the outgoing beam is attenuated by the beamsplitter and substantially decreases efficiency for diffuse targets.

SUMMARY OF THE INVENTION

An illumination and imaging system is provided with a co-axial illuminator that does not include a beamsplitter. The co-axial illuminator achieves efficiencies substantially in excess of those achieved with a beamsplitter. In one aspect, an optical stop is used to reflect illumination upon a target. The optical stop includes an aperture allowing light reflected from the target to pass to a detector. The aperture of the stop has an asymmetrical feature that facilitates operation on specular targets.

DETAILED DESCRIPTION OF THE ILLUSTRATIVE EMBODIMENTS

Figure 1:
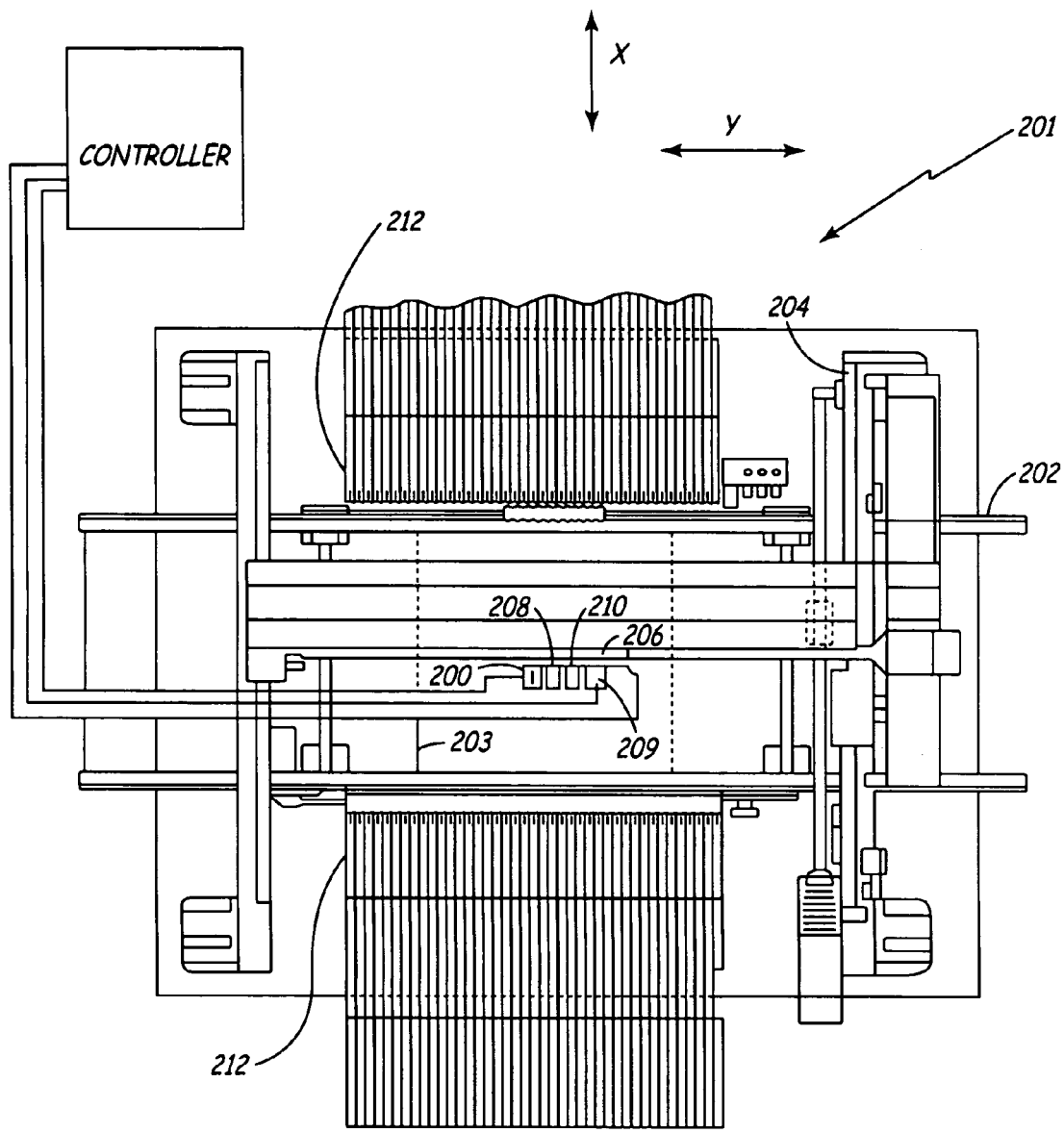
FIG. 1 shows a pick and place machine.

An electronics assembly machine, specifically, a pick and place machine, is shown generally in FIG. 1. Machine 201 includes conveyor system 202 for transporting a printed circuit board. 203 into a working area. Pick and place machine 201 includes an x and y motor drive assembly 204 for moving placement head 206 independently in the x and y directions. Attached to head 206 are multiple vacuum nozzles 208, and 210 for releasably coupling to one or more components. Head 206 picks one or more components from trays 212 and while head 206 is transporting the components to printed circuit board 203, sensor 200 senses the x,y and theta orientation of the components. Since sensor 200 is positioned on head 206, it is considered an on-head sensor and senses the x, y and theta orientation of the components while head 206 transports the components to board 203. FIG. 1 also illustrates camera 209 located on head 206. Generally, camera 209 is used to image reference marks or "fiducials" or board artwork located on the circuit board 203 in order to provide location information to machine 201.

Figure 2:
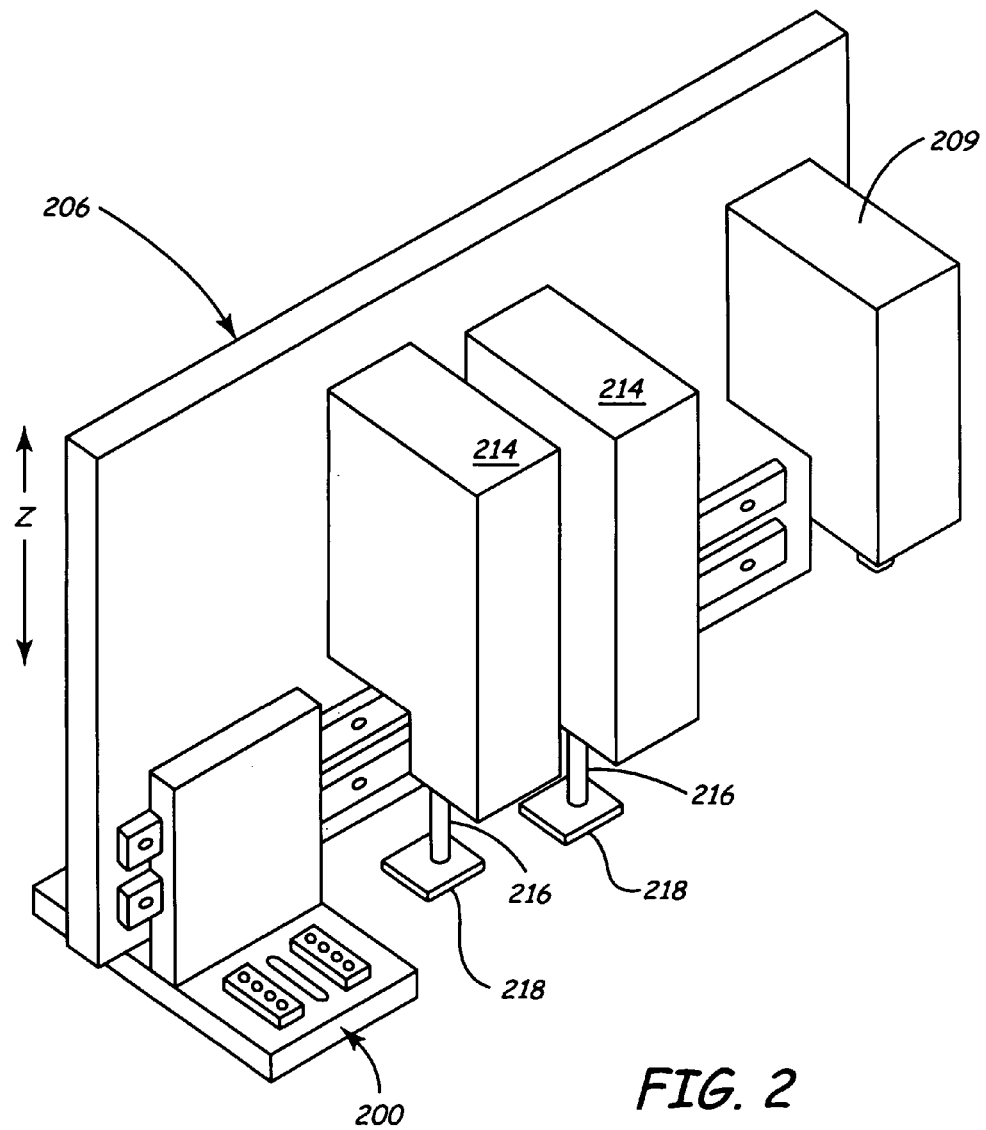
FIG. 2 is a diagrammatic view of a placement head of a pick and place machine.

FIG. 2 is a perspective view of placement head 206. As illustrated, placement head 206 includes a pair of pick and place units 214 each of which includes a nozzle 216 that is adapted to releasably couple a component to be placed such as components 218. Pick and place units 214 are adapted to displace components 218 along the Z axis to place components 218 upon a circuit board 203 (shown in FIG. 1). While components 218 are releasably held by nozzles 216, component align sensor 200 is translated with respect to components 218 while imaging components 218 such that the relative orientations of components 218 with respect to circuit board 203 can be computed. FIG. 2 also illustrates board align (BA) camera 209 disposed proximate an edge of placement head 206 and facing downward. BA camera 209 acquires an image of a reference position marker (fiducial) on circuit board 203 in order to allow calculation of the placement head 206 position with respect to circuit board 203.

Figure 3A:
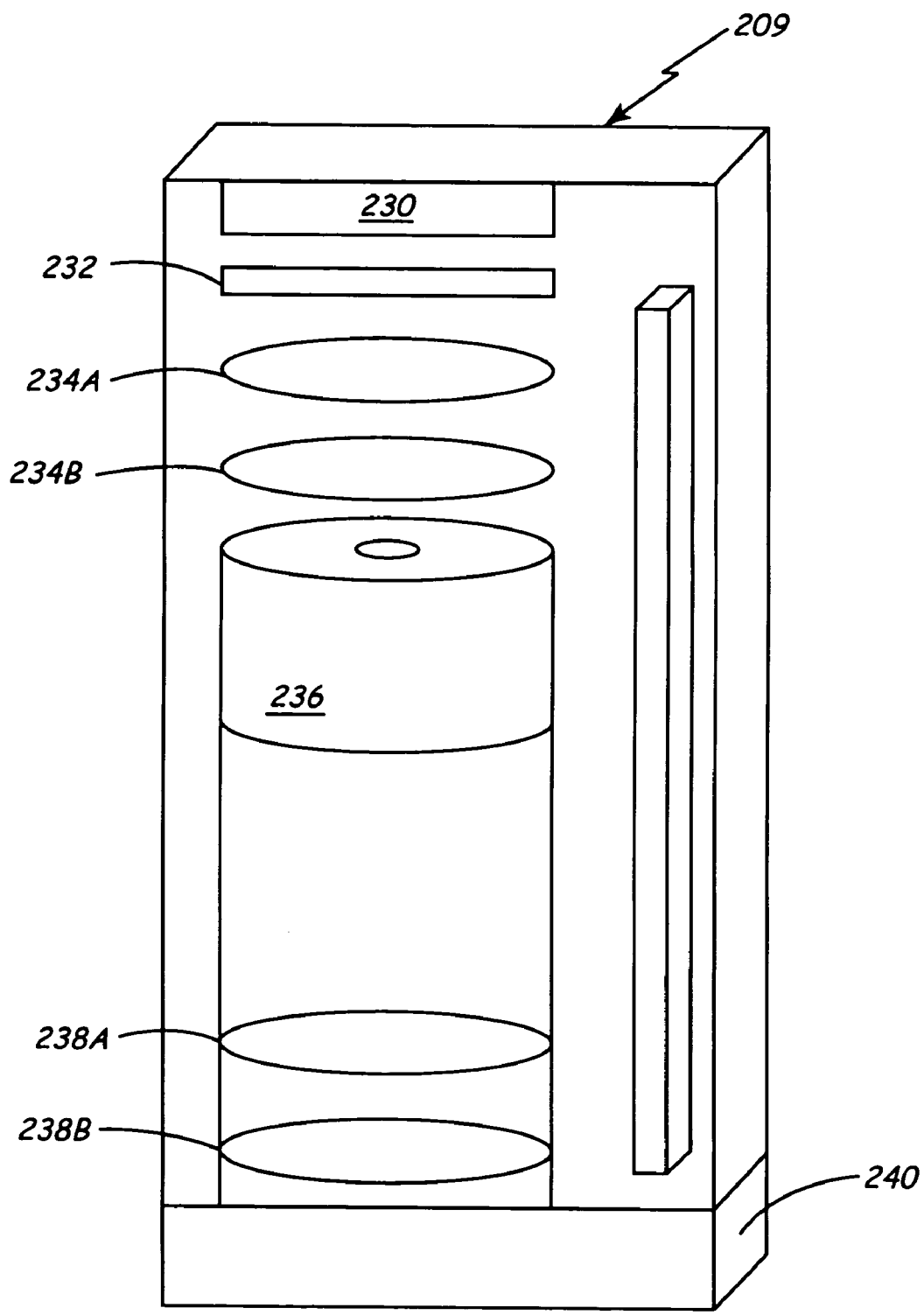
FIGS. 3A and 3B are diagrammatic views of an imaging system including a co-axial illuminator in accordance with an embodiment of the present invention.

FIG. 3A is a diagrammatic view of board align camera 209 in accordance with an embodiment of the present invention. Camera 209 includes detector 230 which can be any suitable detector including a Charge Coupled Device (CCD) array. Detector 230 is coupled to image processing electronics (not shown) which receive the image detected by detector 230. Optional filter 232 can be disposed in front of detector 230 to filter the image arriving at detector 230. A first pair of optics 234A and 234B are positioned in front of filter 232 and are selected to focus incoming rays upon detector 230. Optics 234A and 234B can be considered a first lens cell. Although the first lens cell is illustrated as a pair of optics, the first lens cell can include any suitable number of lenses, including a single lens. Co-axial illuminator 236 is positioned in front of the first lens cell and allows the image to pass therethrough, while simultaneously injecting illumination substantially along the optical axis of camera 209. Illuminator 236 will be described in greater detail with respect to FIG. 3B. Optics 238A and 238B (also referred to as a second lens cell) are positioned in front of illuminator 236 and cooperate to receive diverging ray bundles from a target of interest and bend the rays such that they remain parallel to one another. The second lens cell can also include any suitable number of lenses including a single lens. The rays remain parallel to one another until they pass through the first lens cell where they are caused to converge upon detector 230. Those skilled in the art will recognize that the first and second lens cells form a doubly telecentric optical system that surrounds illuminator 236. FIG. 3A also illustrates optional darkfield illuminator 240. Darkfield illuminator 240 provides illumination to the target of interest at a relatively high angle of incidence. While only darkfield illuminator 240 is shown, those skilled in the art will recognize that many other types of illumination could be used as desired.

Figure 3B:
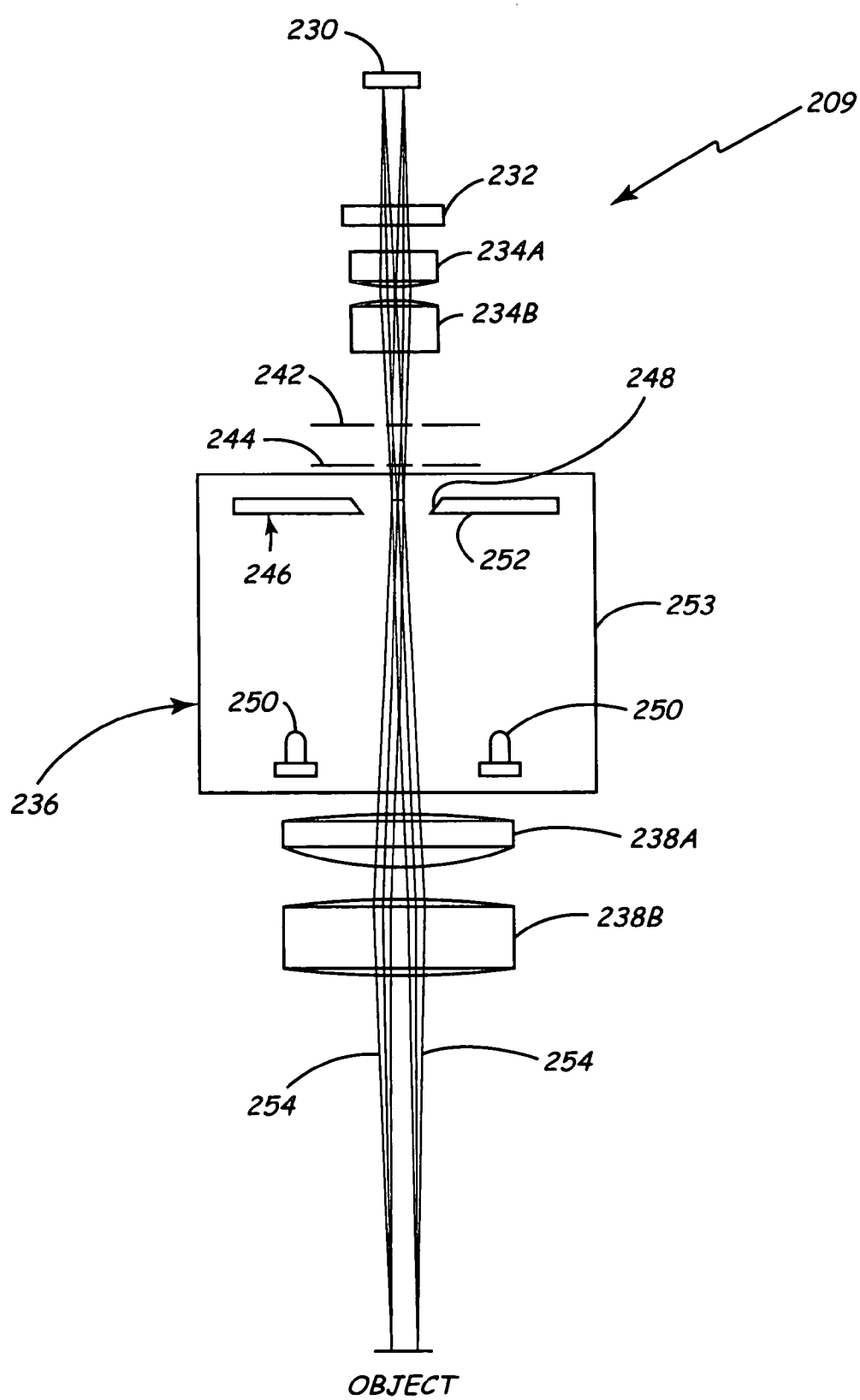

FIG. 3B is a diagrammatic view of camera 209 illustrating operation of the optics. FIG. 3B also shows illuminator 236 in greater detail. FIG. 3B illustrates the first lens cell (234A, 234B) receiving rays that are parallel to one another, and bending them slightly such that they converge upon detector 230 after passing through filter 232. A pair of baffles 242, 244 are positioned between the first lens cell and co-axial illuminator 236. A stop 246 is included within illuminator 236. Stop 246 includes an aperture 248 through which the rays pass. Stop 246 will be shown in greater detail in FIGS. 4A and 4B. One or more light sources 250 are disposed within enclosure 253. Sources 250 can take the form of Light Emitting Diodes (LED's), incandescent lights, lasers, and/or any other suitable type of light. Source(s) 250 are arranged to direct light toward stop 246. Stop 246 includes a surface 252 that reflects at least some light substantially along the optical axis of camera 209. In some embodiments, surface 252 can be stainless steel and preferably is diffuse. Surface 252 can also be provided with a diffuse reflective coating.

Illuminator 236 preferably includes an enclosure 253 having a reflective interior such that additional rays emanating from source(s) 250 are aligned with the optical axis thereby increasing the efficiency of illuminator 236. In a preferred embodiment, enclosure 253 is cylindrical.

Optics 238A and 238B form a second lens cell that receives diverging rays 254 and bends rays 254 such that they are substantially parallel with respect to one another. Thus, the first and second lens cells form an optical system that surrounds co-axial illuminator 236 and is telecentric in object space. However, embodiments of the present invention can be practiced advantageously in a non-telecentric optical system as well.

Figure 4B:
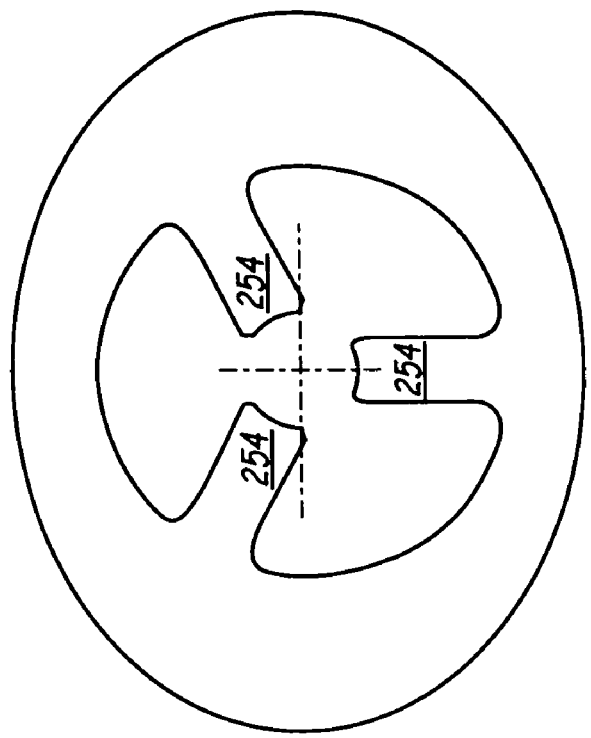
FIG. 4B is an enlarged view of an aperture within the stop shown in FIG. 4A
Figure 4A:
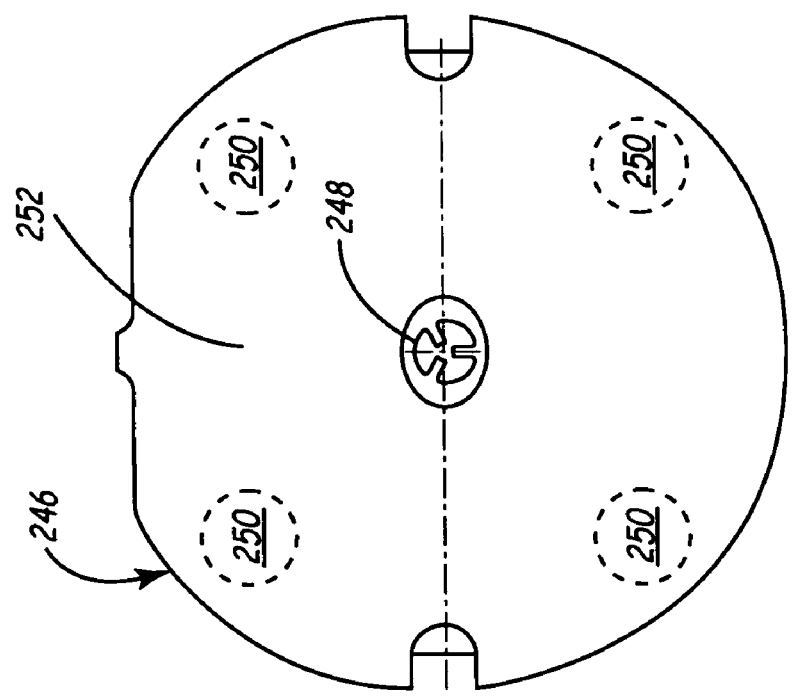
FIG. 4A is a top plan view of a stop in accordance with an embodiment of the present invention.

FIG. 4A is a top plan view of stop 246 in accordance with an embodiment of the present invention. Stop 246 is preferably positioned above four Light Emitting Diodes 250 (illustrated in dashed lines), however any suitable number of sources may be used. Stop 246 includes aperture 248, which is preferably disposed at the center of stop 246. Surface 252 of stop 246 is a diffuse reflective surface. Thus, light from sources 250 projected normal to surface 252 is reflected off surface 252 to create the co-axial illuminator. It is feasible to depart from a normal illumination angle, provided that the light returning by specular reflection from horizontal target surface 252 is unobstructed. (A horizontal mirror would be an example of a specular horizontal target surface.) Suppose that a ray originates in the plane of stop 246 non-coincident with the optical axis, and it experiences a specular reflection from horizontal surface 252. By accepted laws of reflection, the ray will return to the plane of stop 246 at a transverse location on stop 246 relative to the optical axis that is directly opposite the point of origin. If stop 246 has an aperture that is symmetric about the optical axis, every ray that originates on the reflective surface of stop 246 (that is, outside aperture 248) will, on its return, intersect another opposite point outside aperture 248 and be blocked. Such a system would therefore undesirably obstruct all specular reflections from horizontal target surface 252. To overcome this problem, an asymmetry must be introduced into aperture 248. In order to facilitate this arrangement, tangs 254 are disposed such that substantially no obstructions are present on the opposite side of aperture 248 for any given tang. In a preferred embodiment, three tangs 254 are positioned as illustrated in FIG. 4B, though other asymmetrical apertures could be used advantageously. Using embodiments of the present invention allows use of a co-axial illuminator with specular targets without requiring a beamsplitter. It will be appreciated by those skilled in the art that any beamsplitter would attenuate outgoing light, whereas embodiments of the present invention avoid such attenuation. The return beam is attenuated by the tangs, but can be arranged to be no worse than the attenuation imposed by a beamsplitter. The efficiency of the system is thereby increased over that achievable using a beamsplitter.

Although the present invention has been described with reference to preferred embodiments, workers skilled in the art will recognize that changes may be made in form and detail without departing from the spirit and scope of the invention.

What is claimed is:

1. An illumination and imaging system for acquiring an image of an illuminated target of interest, system comprising:
   a detector for receiving light and providing an electrical representation of an image;
   an optical system optically coupled to the detector;
   a stop disposed within the optical system and having an aperture for passing a portion of the light therethrough, the stop having at least one feature extending inwardly from the aperture, and no feature diametrically opposite the at least one feature; and a light source mounted between the target and the stop, the light source shining light substantially normally onto a surface of the stop, wherein light reflected from the surface of the stop onto the target forms light received at the detector.

2. The system of claim 1, wherein the stop is formed of stainless steel.

3. The system of claim 1, wherein the stop includes a diffuse surface.

4. The system of claim 1, wherein the stop is coated with diffuse reflective material.

5. The system of claim 1, and further comprising a plurality of additional light sources mounted substantially coplanar with the light source.

6. The system of claim 1, wherein the light source includes a Light Emitting Diode.

7. The system of claim 1, and further comprising a plurality of additional light source disposed to shine light substantially normally with respect to the surface of the stop.

8. The system of claim 1, wherein the optical system is telecentric and includes a first lens cell positioned between the detector and the stop.

9. The system of claim 8, and further comprising a baffle positioned between the first lens cell and the stop.

10. The system of claim 9, and further comprising at least one additional baffle positioned between the baffle and the stop.

11. The system of claim 1, wherein the stop and the light source are enclosed within an enclosure having a reflective interior.

12. The system of claim 11, wherein the enclosure is cylindrically shaped.

13. The system of claim 1, wherein the detector is a CCD array.

14. The system of claim 1, wherein the light source is positioned within the optical system and wherein the optical system is telecentric.

15. The system of claim 1, and further comprising a plurality of tangs extending into the aperture and arranged asymmetrically about the aperture.

16. The system of claim 1, wherein the optical system is telecentric in object space.

17. The system of claim 1, and further comprising at least one tang extending into the aperture and arranged asymmetrically about the aperture.

18. An illuminator comprising:
   a enclosure having an optical axis passing therethrough;
   a stop disposed within the enclosure, the stop having a reflective surface and an aperture, wherein at least one tang extends into the aperture, and wherein a portion of the aperture opposite the at least one tang does not include a tang; and
   at least one light source disposed within the enclosure and adapted to direct light toward the reflective surface substantially normally to the reflective surface.

* * * * *